(12) United States Patent
Shen et al.

(10) Patent No.: US 11,303,273 B2
(45) Date of Patent: Apr. 12, 2022

(54) MILLER CLAMP DRIVE CIRCUIT

(71) Applicant: SANTAK ELECTRONIC (SHENZHEN) CO., LTD., Shenzhen (CN)

(72) Inventors: Zhimin Shen, Shenzhen (CN); Huafen Ouyang, Shenzhen (CN); Xuegang Liu, Shenzhen (CN)

(73) Assignee: SANTAK ELECTRONIC (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/234,040

(22) Filed: Apr. 19, 2021

(65) Prior Publication Data

US 2021/0336617 A1 Oct. 28, 2021

(30) Foreign Application Priority Data

Apr. 28, 2020 (CN) .......................... 202010349720.4

(51) Int. Cl.
*H02M 1/08* (2006.01)
*H03K 17/60* (2006.01)
*H03K 17/082* (2006.01)

(52) U.S. Cl.
CPC .............. *H03K 17/60* (2013.01); *H02M 1/08* (2013.01); *H03K 17/0822* (2013.01); *H03K 2217/0081* (2013.01)

(58) Field of Classification Search
CPC .................................. H02M 1/08; H03K 17/60
USPC .................................. 327/108, 109, 110, 111
See application file for complete search history.

(56) References Cited

U.S. PATENT DOCUMENTS

| | | | |
|---|---|---|---|
| 2018/0115311 A1* | 4/2018 | Norling | G05F 3/02 |
| 2020/0044635 A1* | 2/2020 | Ju | H03K 4/48 |
| 2020/0076425 A1* | 3/2020 | Garg | H03K 17/693 |
| 2021/0159898 A1* | 5/2021 | Westwick | H03K 17/0828 |
| 2021/0234538 A1* | 7/2021 | Song | H02M 1/34 |

* cited by examiner

*Primary Examiner* — William Hernandez
(74) *Attorney, Agent, or Firm* — Stanek Lemon Crouse & Meeks, P.A.

(57) ABSTRACT

The present invention provides a Miller clamp drive circuit, including a drive chip which includes an output terminal configured to output a driving signal, a clamp terminal, a power terminal and a controllable switch connected between the clamp terminal and the power terminal; a drive resistor, one terminal of which is connected to the output terminal of the drive chip and the other terminal of which is used to connect to a control electrode of a power switching transistor; and a Miller clamp circuit including a first voltage divider circuit which is connected between the other terminal of the drive resistor and the clamp terminal and configured to have a preset voltage drop, and a second voltage divider circuit connected between the clamp terminal and the power terminal. The Miller clamp drive circuit of the present invention increases the Miller clamp voltage and decreases the tailing time of the power switching transistor.

19 Claims, 6 Drawing Sheets

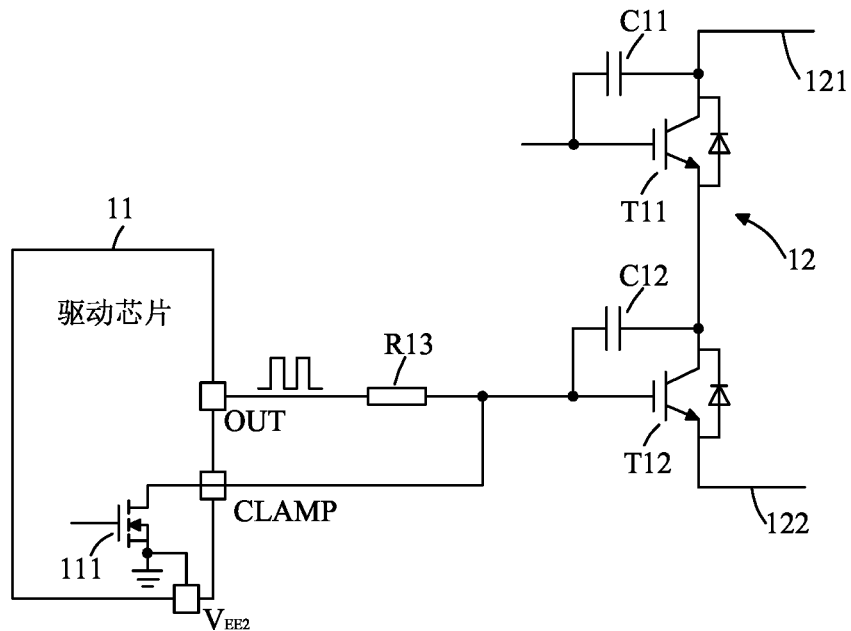
Fig. 1    (Prior Art)
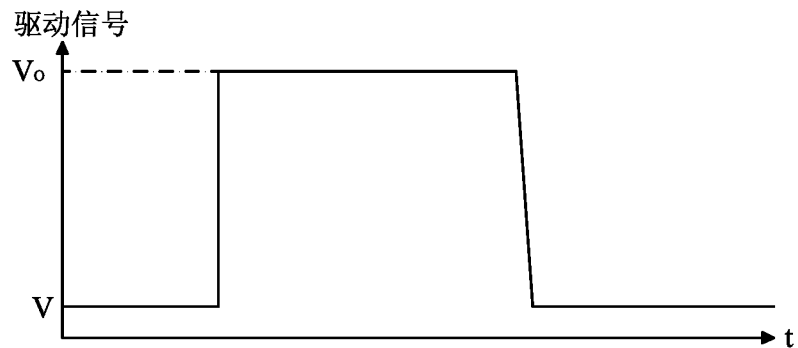
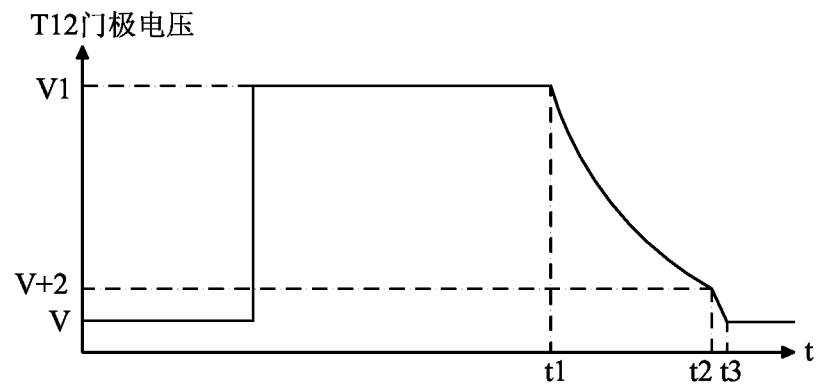
Fig. 2    (Prior Art)

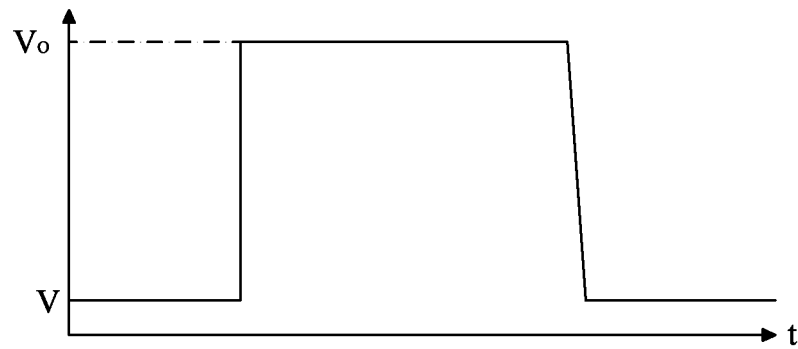
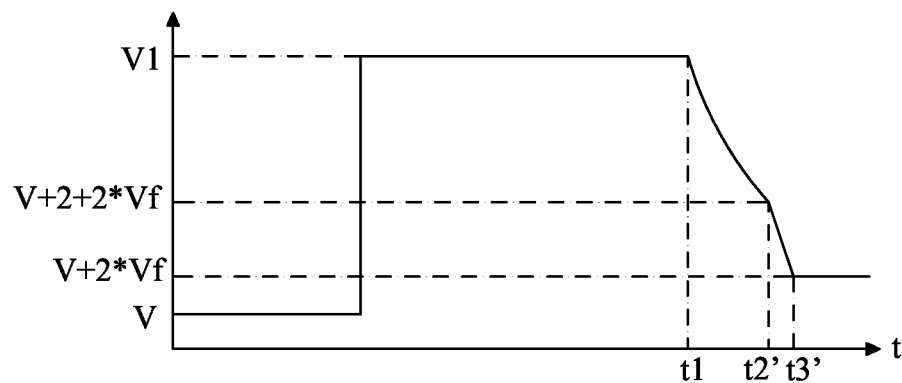
Fig. 4
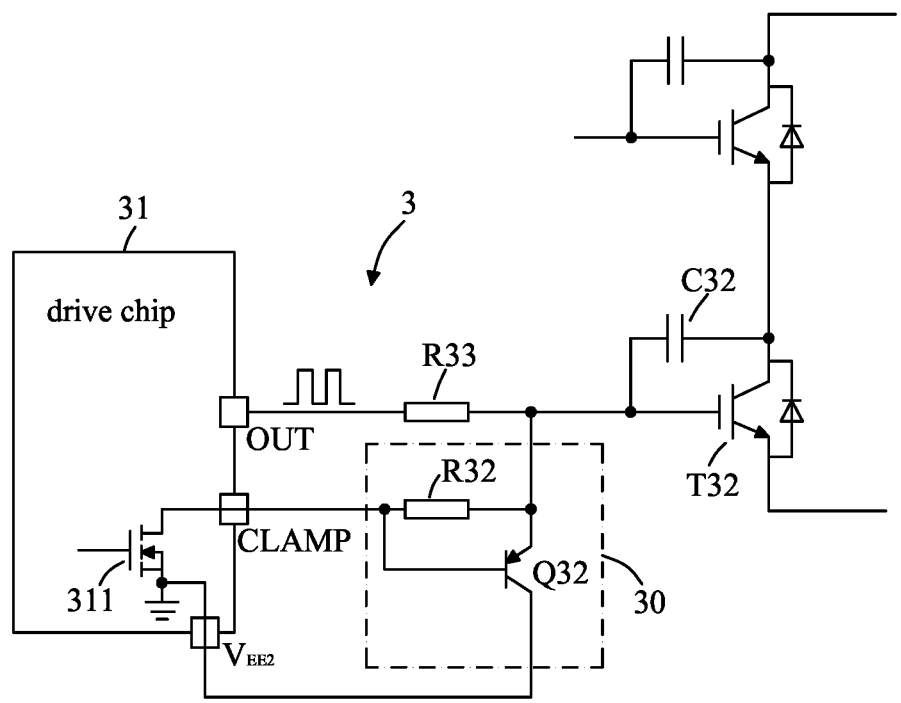
Fig. 5

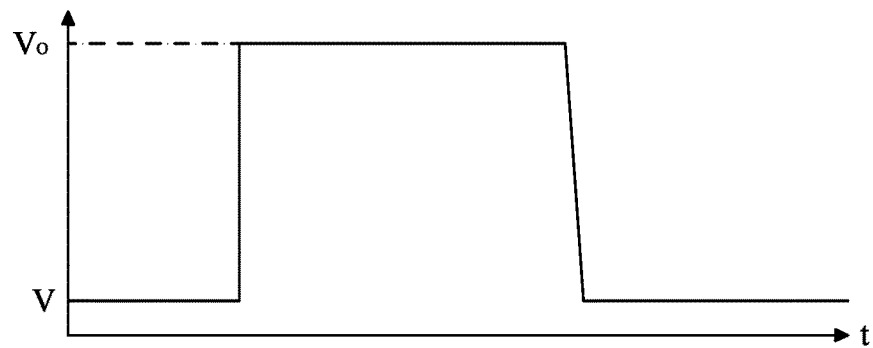
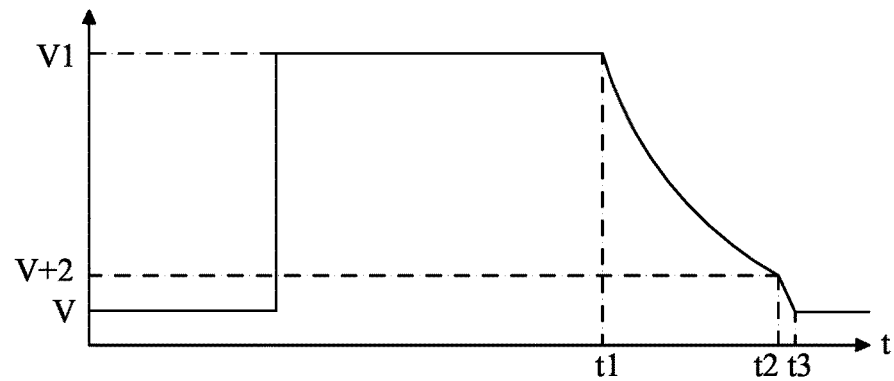
Fig. 6
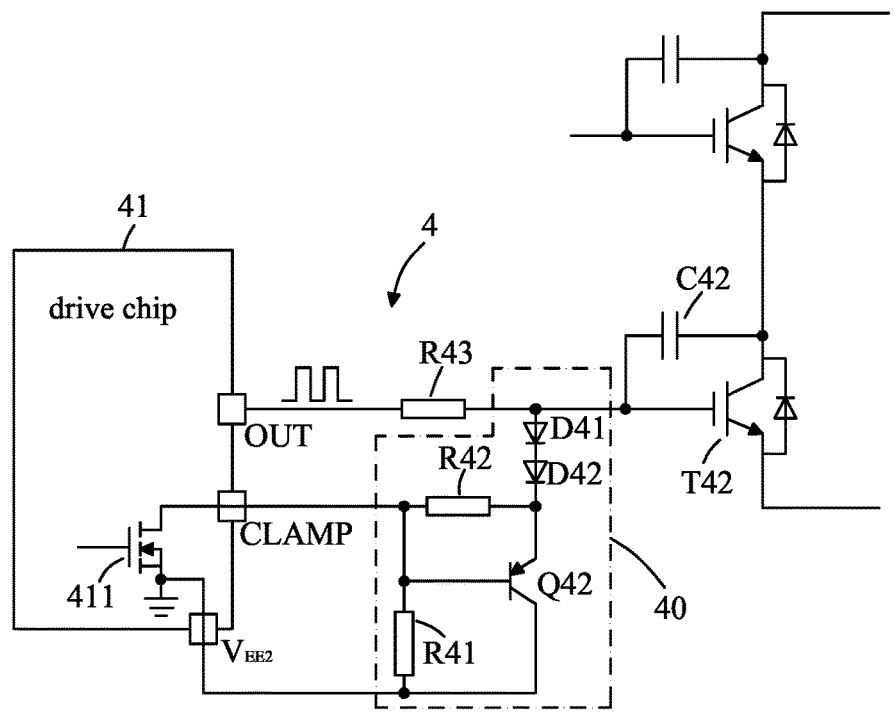
Fig. 7

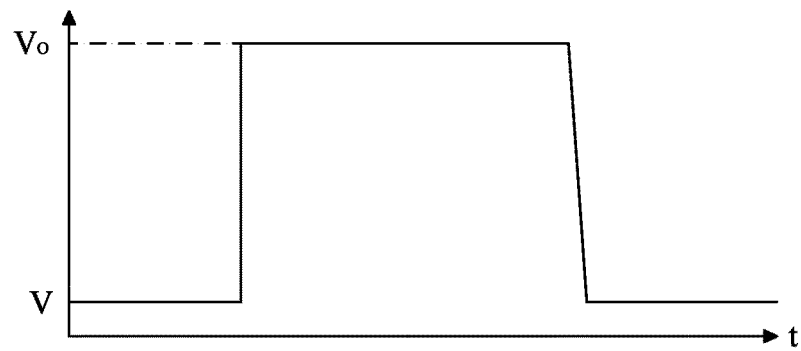
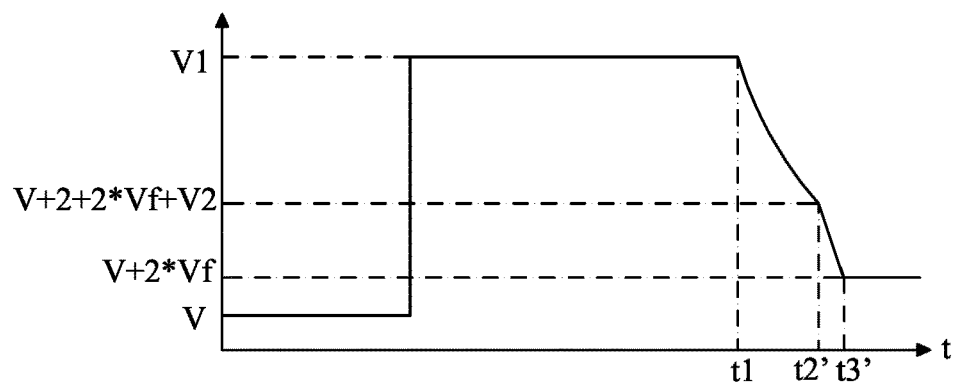
Fig. 8
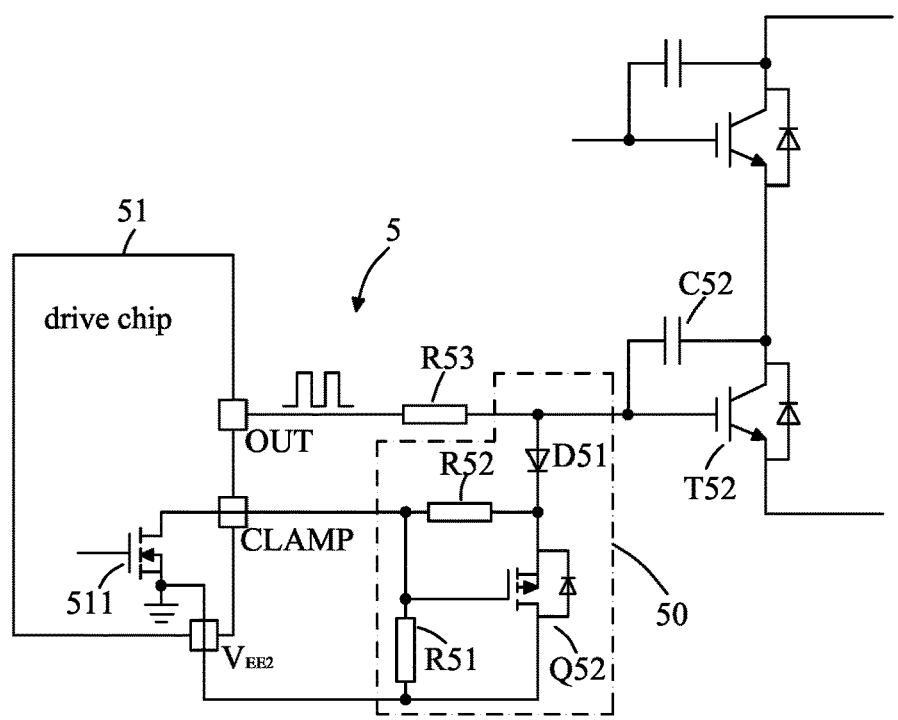
Fig. 9

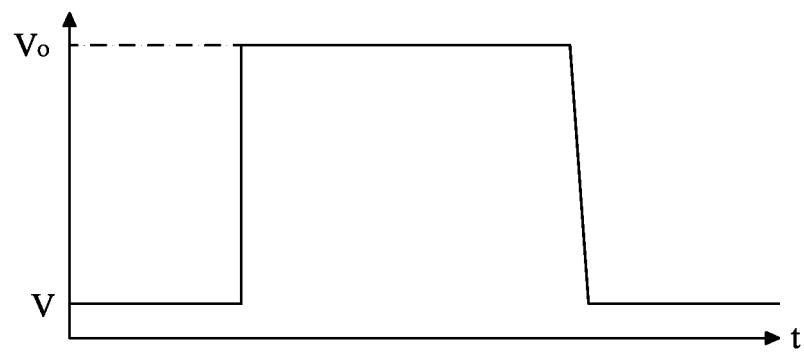
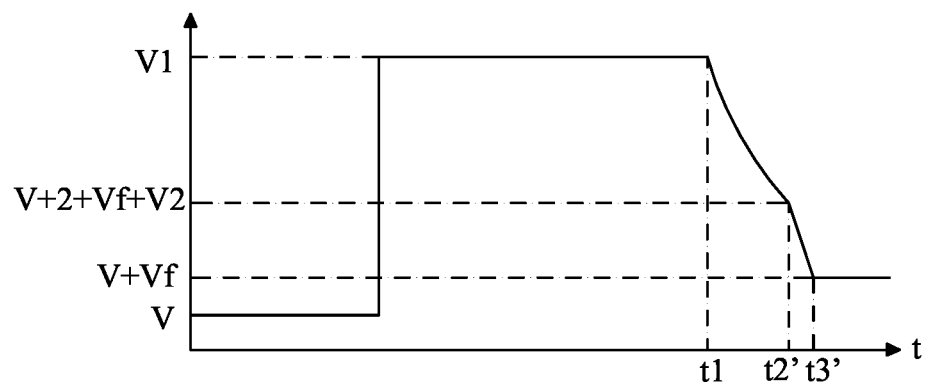
Fig. 10

US 11,303,273 B2

MILLER CLAMP DRIVE CIRCUIT

CROSS-REFERENCE TO RELATED APPLICATIONS

The present application claims priority to Chinese Patent Application No. 202010349720.4; filed Apr. 28, 2020, entitled MILLER CLAMP DRIVE CIRCUIT, the disclosure of which is incorporated herein by reference in its entirety.

TECHNICAL FIELD

The present invention relates to a drive circuit, in particular to a Miller clamp drive circuit.

BACKGROUND

The present application also incorporates the following commonly owned disclosures by reference in their entireties: U.S. Non-provisional patent application Ser. No. 16/784,843 entitled Apparatus For Forming Single Crystal Piezoelectric Layers Using Low-Vapor Pressure Metalorganic Precursors In CVD Systems And Methods Of Forming Single Crystal Piezoelectric Layers A parasitic Miller capacitor is provided between a gate (or known as a grid) and a collector of an Insulated Gate Bipolar Transistor (IGBT), so the Miller effect caused by the Miller capacitor is very significant in power switching transistors. The Miller capacitor increases a gate voltage of the IGBT, which may cause the IGBT to be turned on by mistake. Similarly, the parasitic Miller capacitor in a Metal-Oxide-Semiconductor Field-Effect Transistor (MOSFET) will also cause the Miller effect.

FIG. 1 is a circuit diagram in which a drive circuit and a power switching transistor are connected in the existing technology. For ease of understanding, FIG. 1 only shows the power switching transistors such as IGBT T11 and IGBT T12 in a switching circuit 12, and an output terminal OUT, a clamp terminal CLAMP and a power terminal VEE2 in an ISO5852, NCD57000 or ADUM4135 drive chip 11, where the power terminal VEE2 is connected to a reference potential point having a voltage V (e.g., −8 volt to −6 volt) lower than a ground potential.

As shown in FIG. 1, the IGBT T11 and the IGBT T12 are connected between a positive DC bus 121 and a negative DC bus 122, a Miller capacitor C11 of the IGBT T11 is connected between a gate and a collector of the IGBT T11, and a Miller capacitor C12 of the IGBT T12 is connected between a gate and a collector of the IGBT T12. The output terminal OUT of the drive chip 11 outputs high and low level driving signals to the gate (i.e., a control electrode) of the IGBT T12 through a drive resistor R13 to control turn-on and turn-off (or known as cut-off) of the IGBT T12. The clamp terminal CLAMP is connected to the gate of the IGBT T12 through a lead, and is connected to the power terminal VEE2 through a controllable switch 111 built in the drive chip 11. When the voltage received by the clamp terminal CLAMP is lower than a predetermined Miller clamp voltage (e.g., V+2 volt) of the drive chip 11, the drive chip 11 triggers a Miller clamp and provides a switch-on signal to the controllable switch 111 to switch it on.

When the IGBT T11 is controlled to be turned on, an extra high transient voltage variation occurs between the collector and an emitter of the IGBT T12, and a discharge current is generated in the Miller capacitor C12 and the drive resistor R13, which causes a voltage difference between the gate and the emitter of the IGBT T12. When exceeding a gate driving threshold, the voltage difference will cause the IGBT T12 to be turned on by mistake.

FIG. 2 shows voltage oscillograms of a driving signal output by the drive chip shown in FIG. 1 and a gate voltage of the IGBT. As shown in FIG. 2, when the output terminal OUT of the drive chip 11 outputs a high level VO (e.g., 15 volt to 18 volt) driving signal, the gate voltage of the IGBT T12 is V1 (which is slightly lower than VO) to control the IGBT T12 to be turned on.

A process in which the output terminal OUT of the drive chip 11 outputs a low level V (lower than the ground potential, e.g., −8 volt to −6 volt) driving signal to control the IGBT T12 to be turned off (or cut off) is as follows.

Between moments t1 to t2, the Miller capacitor C12 of the IGBT T12 begins to discharge slowly through the drive resistor R13, so that the gate voltage of the IGBT T12 decreases slowly. In this discharge process, the gate voltage of the IGBT T12 decreases from V1 to V+2 volt.

At the moment t2, the gate voltage of the IGBT T12 is V+2 volt, and the voltage received by the clamp terminal CLAMP of the drive chip 11 is also V+2 volt, and the drive chip 11 is in a critical state of triggering the Miller clamp.

Between moments t2 to t3, once the gate voltage of the IGBT T12 is lower than V+2 volt, the Miller clamp of the drive chip 11 is triggered, and the controllable switch 111 is switched on, so that the voltage of the clamp terminal CLAMP quickly drops to V, and the gate voltage of the IGBT T12 also quickly drops to V, thus cutting off the IGBT T12. In the process of triggering the Miller clamp, the Miller clamp current flows from the gate of the IGBT T12 to the power terminal VEE2 through the on-state controllable switch 111 in the drive chip 11.

After the moment t3, the gate voltage of the IGBT T12 is clamped to V, so that the IGBT T12 is in the cut off state.

The drive chip 11 may be ISO5852, NCD57000 and ADUM4135 drive chips in the existing technology, but its predetermined Miller clamp voltage and Miller clamp current are relatively low, only V+2 volt and 2 ampere, respectively, so it cannot be applied to power switching transistors with higher power and higher switching frequency.

SUMMARY

In view of the above technical problem in the existing technology, the present invention provides a Miller clamp drive circuit, the Miller clamp drive circuit comprises:

a drive chip which comprising an output terminal configured to output a driving signal, a clamp terminal, a power terminal and a controllable switch connected between the clamp terminal and the power terminal; the drive chip triggers a Miller clamp to reduce a voltage at the clamp terminal to a voltage at the power terminal when the voltage received at the clamp terminal is lower than a predetermined voltage;

a drive resistor, one terminal of which is connected to the output terminal of the drive chip and the other terminal of which is used to connect to a control electrode of a power switching transistor; and a Miller clamp circuit which includes:

a first voltage divider circuit which is connected between the other terminal of the drive resistor and the clamp terminal and configured to have a preset voltage drop; and a second voltage divider circuit connected between the clamp terminal and the power terminal.

Preferably, the first voltage divider circuit includes: one diode or a plurality of diodes with positive and negative electrodes thereof connected in series in sequence.

Preferably, the second voltage divider circuit is a first resistor.

Preferably, the Miller clamp circuit further includes a third voltage divider circuit connected between the first voltage divider circuit and the second voltage divider circuit; and a controllable switching device, a control electrode of which is connected to the clamp terminal, a first electrode of which is connected to a node formed by connecting the third voltage divider circuit and the first voltage divider circuit, and a second electrode of which is connected to the power terminal. When the voltage received by the clamp terminal is lower than a predetermined Miller clamp voltage of the drive chip, the controllable switch is triggered to be switched on, so that the controllable switching device is in the on state, and the on-resistance of the controllable switching device is less than that of the controllable switch of the drive chip.

Preferably, the third voltage divider circuit is a second resistor, and the amplitude of a voltage across the second resistor is less than that of a turn-on voltage of the controllable switching device when the Miller clamp of the drive chip is not triggered.

Preferably, the controllable switching device is a PNP type triode, a base of which is connected to the clamp terminal, an emitter of which is connected to a node formed by connecting the third voltage divider circuit and the first voltage divider circuit, and a collector of which is connected to the power terminal.

Preferably, the controllable switching device is an enhanced p-channel Metal-Oxide-Semiconductor Field-Effect Transistor (MOSFET), a gate of which is connected to the clamp terminal, a source of which is connected to a node formed by connecting the third voltage divider circuit and the first voltage divider circuit, and a drain of which is connected to the power terminal.

Preferably, the voltage of the power terminal is lower than the ground potential.

The present invention provides a Miller clamp drive circuit, the Miller clamp drive circuit comprises:

a drive chip comprising an output terminal configured to output a driving signal, a clamp terminal, a power terminal and a controllable switch connected between the clamp terminal and the power terminal; the drive chip triggers the Miller clamp to reduce a voltage at the clamp terminal to a voltage at the power terminal when the voltage received at the clamp terminal is lower than a predetermined voltage;

a drive resistor, one terminal of which is connected to the output terminal of the drive chip and the other terminal of which is connected to a control electrode of a power switching transistor; and a Miller clamp circuit which includes:

a third voltage divider circuit connected between the clamp terminal and the other terminal of the drive resistor; and a controllable switching device, a control electrode of which is connected to the clamp terminal, a first electrode of which is connected to the other terminal of the drive resistor, and a second electrode of which is connected to the power terminal;

when the voltage received by the clamp terminal is lower than a predetermined Miller clamp voltage of the drive chip, the controllable switch is triggered to be switched on, so that the controllable switching device is in the on state, and the on-resistance of the controllable switching device is less than that of the controllable switch of the drive chip.

Preferably, the third voltage divider circuit is a second resistor, one terminal of which is connected to the clamp terminal and the other terminal of which is connected to the other terminal of the drive resistor, and the amplitude of a voltage across the second resistor is less than that of a turn-on voltage of the controllable switching device when the Miller clamp of the drive chip is not triggered.

Preferably, the Miller clamp circuit further includes a first voltage divider circuit which is connected between the other terminal of the drive resistor and the third voltage divider circuit and configured to have a preset voltage drop; and a second voltage divider circuit connected between the clamp terminal and the power terminal.

Preferably, the first voltage divider circuit includes one diode or a plurality of diodes with positive and negative electrodes thereof connected in series in sequence.

Preferably, the second voltage divider circuit is a first resistor.

Preferably, the controllable switching device is a PNP type triode, a base of which is connected to the clamp terminal, an emitter of which is connected to the node formed by connecting the first voltage divider circuit and the third voltage divider circuit, and a collector of which is connected to the power terminal.

Preferably, the controllable switching device is an enhanced p-channel Metal-Oxide-Semiconductor Field-Effect Transistor (MOSFET), a gate of which is connected to the clamp terminal, a source of which is connected to a node formed by connecting the first voltage divider circuit and the third voltage divider circuit, and a drain of which is connected to the power terminal.

Preferably, the voltage of the power terminal is lower than the ground potential.

The Miller clamp drive circuit of the present invention has few electronic components and lower cost. In addition, the Miller clamp voltage is increased due to the adoption of hardware circuits such as the diodes and resistors, and the tailing time of the switching transistor is shortened. At the same time, the Miller clamp voltage can be increased according to actual needs. The Miller clamp drive circuit of the present invention may also increase the Miller clamp current. Therefore, the Miller clamp drive circuit may be employed to drive power switching transistors with higher power and higher switching frequency.

BRIEF DESCRIPTION OF THE DRAWINGS

Embodiments of the present invention will be further described below with reference to the accompanying drawings, in which:

FIG. 1 is a circuit diagram in which a drive circuit and a power switching transistor are connected in the existing technology;

FIG. 2 shows voltage oscillograms of a driving signal output by a drive chip shown in FIG. 1 and a gate voltage of an Insulated Gate Bipolar Transistor (IGBT);

FIG. 4 shows voltage oscillograms of a driving signal output by a drive chip shown in FIG. 3 and a gate voltage of an IGBT;

FIG. 5 is a circuit diagram in which a Miller clamp drive circuit and a power switching transistor are connected according to a second embodiment of the present invention;

FIG. 6 shows voltage oscillograms of a driving signal output by a drive chip shown in FIG. 5 and a gate voltage of the IGBT;

FIG. 7 is a circuit diagram in which a Miller clamp drive circuit and a power switching transistor are connected according to a third embodiment of the present invention;

FIG. 8 shows voltage oscillograms of a driving signal output by a drive chip shown in FIG. 7 and a gate voltage of an IGBT;

FIG. 9 is a circuit diagram in which a Miller clamp drive circuit and a power switching transistor are connected according to a fourth embodiment of the present invention; and FIG. 10 shows voltage oscillograms of a driving signal output by a drive chip shown in FIG. 9 and a gate voltage of an IGBT.

DETAILED DESCRIPTION

Figure 3:
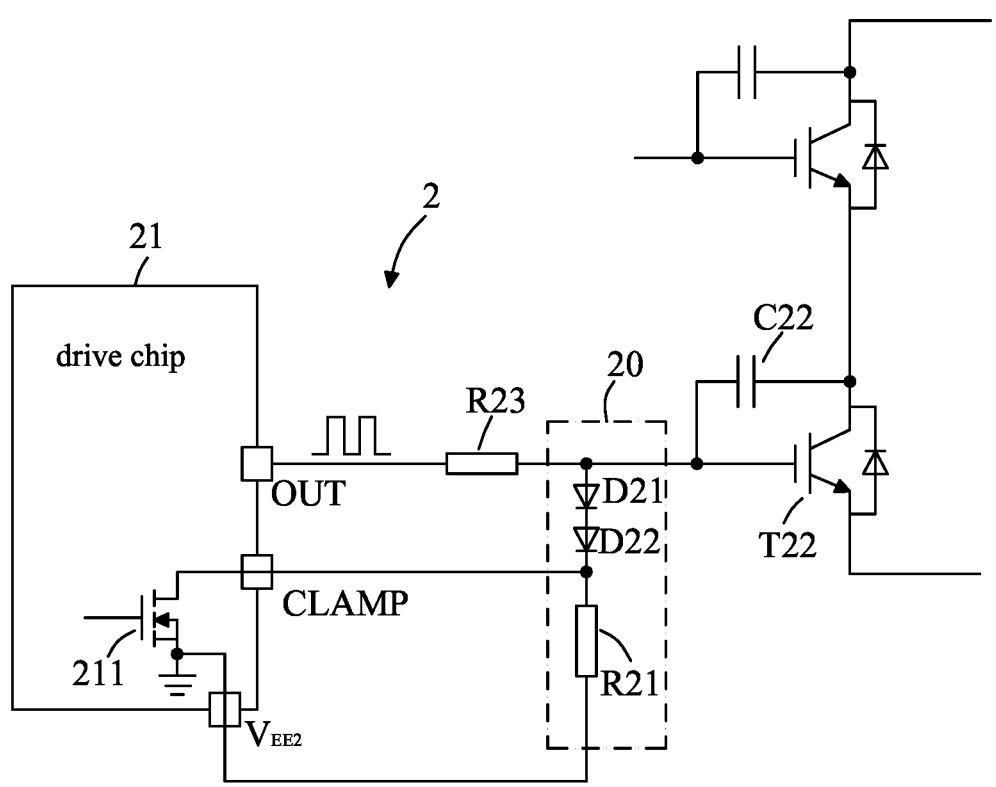
FIG. 3 is a circuit diagram in which a Miller clamp drive circuit and a power switching transistor are connected according to a first embodiment of the present invention.

In order to make the objective, technical solutions and advantages of the present invention more clear, the present invention will be further described in detail below with reference to the accompanying drawings by embodiments.

FIG. 3 is a circuit diagram in which a Miller clamp drive circuit and a power switching transistor are connected according to a first embodiment of the present invention. As shown in FIG. 3, the Miller clamp drive circuit 2 includes a drive chip 21, a drive resistor R23 and a Miller clamp circuit 20.

The drive chip 21 is the same as the drive chip 11, so its specific circuit topology will not be repeated herein. The drive chip 21 also includes an output terminal OUT, a clamp terminal CLAMP, a power terminal VEE2, and a controllable switch 211 connected between the clamp terminal CLAMP and the power terminal VEE2, wherein the power terminal VEE2 is connected to a reference potential point having a voltage V (e.g., −8 volt to −6 volt) lower than the ground potential. When the voltage received by the clamp terminal CLAMP is lower than a predetermined Miller clamp voltage (e.g., V+2 volt) of the drive chip 21, the drive chip 21 triggers a Miller clamp and provides a switch-on signal to the controllable switch 211 to switch it on.

The drive resistor R23 is connected between the output terminal OUT of the drive chip 21 and a gate (i.e., a control electrode) of an Insulated Gate Bipolar Transistor (IGBT) T22, and the on/off time of the IGBT T22 can be adjusted by selecting an appropriate resistance value.

The Miller clamp circuit 20 includes a diode D21 and a diode D22 connected in series, and a resistor R21. A positive electrode of the diode D21 is connected to the gate of IGBT T22, and a negative electrode of the diode D21 is connected to a positive electrode of diode D22, a negative electrode of diode D22 is connected to the clamp terminal CLAMP of the drive chip 21, and both ends of the resistor R21 are connected between the clamp terminal CLAMP and the power terminal VEE2 of the drive chip 21.

FIG. 4 shows voltage oscillograms of a driving signal output by the drive chip shown in FIG. 3 and the gate voltage of the IGBT. As shown in FIG. 4, when the output terminal OUT of the drive chip 21 outputs a high level VO (e.g., 15 volt to 18 volt) driving signal, the gate voltage of the IGBT T22 becomes V1 (which is slightly lower than VO) to control the IGBT T22 to be turned on.

A process in which the output terminal OUT of the drive chip 21 outputs a low level V (lower than the ground potential, e.g., −8 volt to −6 volt) driving signal to control the IGBT T12 to be turned off (or cut off) is as follows.

Between moments t1 to t2', a Miller capacitor C22 and a gate capacitor Cge (or a gate-emitter capacitor) of the IGBT T22 begin to discharge slowly through the drive resistor R23, so that the gate voltage of the IGBT T22 decreases slowly from V1 to V+2+2*Vf, where V is the voltage of the power terminal VEE2, V+2 volt is the predetermined Miller clamp voltage of the drive chip 21, and Vf is a voltage drop (e.g., 0.7 V) of the diode D21 or D22.

At the moment t2', the gate voltage of the IGBT T22 is V+2+2*Vf, and the voltage of the clamp terminal CLAMP of the drive chip 21 is V+2 volt, and the drive chip 21 is in a critical state of triggering the Miller clamp.

Between moments t2' to t3', once the gate voltage of the IGBT T22 is lower than V+2+2*Vf, the Miller clamp of the drive chip 21 is triggered, and the controllable switch 211 is switched on, so that the voltage of the clamp terminal CLAMP is quickly pulled down to V, and the gate voltage of the IGBT T22 quickly drops to V+2*Vf to ensure that the IGBT T22 is cut off without being turned on by mistake. In the process of triggering the Miller clamp, the Miller clamp current flows from the gate of the IGBT T22 to the power terminal VEE2 successively through the diodes D21 and D22 connected in series, the clamp terminal CLAMP and the on-state controllable switch 211.

After the moment t3', the gate voltage of the IGBT T22 is clamped to V+2*Vf to ensure that the IGBT T22 is in the cut off state.

It can thus be seen that the Miller clamp voltage of the Miller clamp drive circuit 2 increases from V+2 volt to V+2+2*Vf volt. The Miller clamp circuit 20 allows the drive chip 21 to trigger the Miller clamp faster, thus shortening the tailing time of the IGBT T22.

The diodes D21 and D22 connected in series and the resistor R21 in the Miller clamp circuit 20 are connected between the gate of the IGBT T22 and the power terminal VEE2 of the drive chip 21. When the Miller capacitor C22 discharges through the drive resistor R23 during the moments t1 to t2', the resistor R21 and the series-connected diodes D21 and D22 form a conductive path between the Miller capacitor C22 and the power terminal VEE2, enabling the diodes D21 and D22 to be turned on and to have a fixed voltage drop, and the voltage received by the clamp terminal CLAMP of the drive chip 21 is equal to the gate voltage of the IGBT T22 minus 2*Vf, accordingly. Therefore, the drive chip 21 can begin to trigger the Miller clamp when the gate voltage of the IGBT T22 is V+2+2*Vf volt.

The Miller clamp circuit 20 in this embodiment has few electronic components and lower cost. In addition, the adoption of hardware circuits such as diodes and resistors increases the Miller clamp voltage, leading to a high reliability.

FIG. 5 is a circuit diagram in which a Miller clamp drive circuit and a power switching transistor are connected according to a second embodiment of the present invention. As shown in FIG. 5, the Miller clamp drive circuit 3 includes a drive chip 31, a drive resistor R33 and a Miller clamp circuit 30.

The drive chip 31 is the same as the drive chip 21, so its specific circuit topology will not be repeated herein. The drive chip 31 also includes an output terminal OUT, a clamp terminal CLAMP, a power terminal VEE2, and a controllable switch 311 connected between the clamp terminal CLAMP and the power terminal VEE2.

The drive resistor R33 is connected between the output terminal OUT of the drive chip 31 and a gate (i.e., a control electrode) of an Insulated Gate Bipolar Transistor (IGBT) T32.

The Miller clamp circuit 30 includes a PNP type triode Q32 and a resistor R32, where the resistor R32 is connected between a base (i.e., a control electrode) and an emitter of the triode Q32. The emitter of the triode Q32 is connected to the gate of the IGBT T32, the base of the triode Q32 is connected to the clamp terminal CLAMP of the drive chip 31, and a collector of the triode Q32 is connected to the power terminal VEE2 of the drive chip 31.

FIG. 6 shows voltage oscillograms of a driving signal output by the drive chip shown in FIG. 5 and the gate voltage of the IGBT. As shown in FIG. 6, when the output terminal OUT of the drive chip 31 outputs a high level VO (e.g., 15 volt to 18 volt) driving signal, the gate voltage of the IGBT T32 becomes V1 (which is slightly lower than VO) to control the IGBT T32 to be turned on.

A process in which the output terminal OUT of the drive chip 31 outputs a low level V (lower than the ground potential, e.g., −8 volt to −6 volt) driving signal to control the IGBT T32 to be turned off (or cut off) is as follows.

Between moments t1 to t2, a Miller capacitor C32 and a gate capacitor Cge (or a gate-emitter capacitor) of the IGBT T32 begin to discharge slowly through the drive resistor R33, so that the gate voltage of the IGBT T32 decreases slowly. In this discharge process, the Miller clamp of the drive chip 31 has not been triggered, and its clamp terminal CLAMP is in a high impedance state, so there is no voltage drop across the resistor R32, the triode Q32 is in the cut off state, and the voltage of the clamp terminal CLAMP is equal to the gate voltage of the IGBT T32.

At the moment t2, the gate voltage of the IGBT T32 is V+2 volt, where V is the voltage of the power terminal VEE2. At this moment, the voltage of the clamp terminal CLAMP of the drive chip 31 is also V+2 volt, and the drive chip 31 is in a critical state of triggering the Miller clamp.

Between moments t2 to t3, once the gate voltage of the IGBT T32 is lower than V+2 volt, the Miller clamp of the drive chip 31 is triggered, and the controllable switch 311 is switched on, so that the voltage of the clamp terminal CLAMP is quickly pulled down to V, a voltage drop of about 2 volt across the resistor R32 makes an emitter junction of the triode Q32 forward biased, and the triode Q32 is thus turned on and in an amplified state. At this moment, the vast majority of the Miller clamp current directly flows to the power terminal VEE2 of the drive chip 31 through the on-state triode Q32. When the on-resistance of the triode Q32 of the present invention is less than that of the controllable switch 311, a higher Miller clamp current is allowed to directly flow to the power terminal VEE2 through the on-state triode Q32, thus increasing the Miller clamp current.

After the moment t3, the gate voltage of the IGBT T32 is clamped to V, so that the IGBT T32 is in the cut off state.

The Miller clamp current of the drive chip 31 can be adjusted by selecting the resistor R32 with an appropriate resistance value. For example, when the resistance value of the resistor R32 increases, the forward bias of the emitter junction of the triode Q32 increases and its collector current increases, thus increasing the Miller clamp current.

FIG. 7 is a circuit diagram in which a Miller clamp drive circuit and a power switching transistor are connected according to a third embodiment of the present invention. As shown in FIG. 7, the Miller clamp drive circuit 4 includes a drive chip 41, a drive resistor R43 and a Miller clamp circuit 40.

The drive chip 41 is the same as the drive chip 21, so its specific circuit topology will not be repeated herein. The drive chip 41 also includes an output terminal OUT, a clamp terminal CLAMP, a power terminal VEE2, and a controllable switch 411 connected between the clamp terminal CLAMP and the power terminal VEE2.

The drive resistor R43 is connected between the output terminal OUT of the drive chip 41 and a gate (i.e., a control electrode) of an Insulated Gate Bipolar Transistor (IGBT) T42.

The Miller clamp circuit 40 includes diodes D41 and D42 connected in series, a resistor R42, a resistor R41 and a triode Q42. The resistor R42 is connected between a base (i.e., a control electrode) and an emitter of the triode Q42, the resistor R41 is connected between the base and a collector of the triode Q42, and the series-connected diode D41 and D42 are connected between the gate of the IGBT T42 and the emitter of the triode Q42. The base of the triode Q42 is connected to the clamp terminal CLAMP of the driver chip 41, and the collector of the triode Q42 is connected to the power terminal VEE2 of the driver chip 41.

FIG. 8 shows voltage oscillograms of a driving signal output by the drive chip shown in FIG. 7 and the gate voltage of the IGBT. As shown in FIG. 8, when the output terminal OUT of the drive chip 41 outputs a high level VO (e.g., 15 volt to 18 volt) driving signal, the gate voltage of the IGBT T42 becomes V1 (which is slightly lower than VO) to control the IGBT T42 to be turned on.

A process in which the output terminal OUT of the drive chip 41 outputs a low level V (lower than the ground potential, e.g., −8 volt to −6 volt) driving signal to control the IGBT T42 to be turned off (or cut off) is as follows.

Between moments t1 to t2', a Miller capacitor C42 and a gate capacitor Cge (or a gate-emitter capacitor) of the IGBT T42 begin to discharge slowly through the drive resistor R43, so that the gate voltage of the IGBT T42 decreases slowly from V1 to V+2+2*Vf+V2 volt, where V is the voltage of the power terminal VEE2, Vf is a voltage drop (e.g., 0.7 V) of the diode D21 or D22, and V2 is a voltage drop across the resistor R42 in the discharge process.

In this discharge process, the gate of the IGBT T42, the diode D41, the diode D42, the resistor R42, the resistor R41 and the power terminal VEE2 form a conductive path, enabling the diodes D41 and D42 to be turn on and to have the voltage drop Vf respectively. The resistor R42 with a smaller resistance value is selected to make the voltage across the resistor R42 lower than the forward bias turn-on voltage (or cut-in voltage) of an emitter junction of the triode Q42, so that the triode Q42 is in the cut off state. At the same time, the voltage received by the clamp terminal CLAMP of the drive chip 41 is higher than V+2 volt, so the Miller clamp of the drive chip 41 has not been triggered, and its clamp terminal CLAMP is in a high impedance state.

At the moment t2', the gate voltage of the IGBT T42 is V+2+2*Vf+V2 volt. At this moment, the voltage of the clamp terminal CLAMP of the drive chip 41 is V+2 volt, and the drive chip 41 is in a critical state triggering the Miller clamp.

Between moments t2' to t3, once the gate voltage of the IGBT T42 is lower than V+2+2*Vf+V2 volt, the Miller clamp of the drive chip 41 is triggered, and the controllable switch 411 is switched on, so that the voltage of the clamp terminal CLAMP quickly is pulled down to V. A voltage drop of 2+V2 volt across the resistor R42 makes the emitter junction of the triode Q42 forward biased, and the triode Q42 is thus turned on and operates in an amplified state. At this moment, the vast majority of the Miller clamp current flows directly to the power terminal VEE2 of the drive chip 41 through the on-state triode Q42. When the on-resistance of the selected triode Q42 is less than that of the controllable switch 411, a higher Miller clamp current is allowed to directly flow to the power terminal VEE2 through the on-state triode Q42, thus increasing the Miller clamp current of the drive chip 41.

After the moment t3', the gate voltage of the IGBT T42 is clamped to V+2*Vf volt, so that the IGBT T42 is in the cut off state.

It can thus be seen that the Miller clamp voltage of the Miller clamp drive circuit 4 increases from V+2 volt to V+2+2*Vf+V2 volt. The Miller clamp circuit 40 allows the drive chip 41 to trigger the Miller clamp faster, thus shortening the tailing time of the IGBT T42. When the Miller clamp of the drive chip 41 is triggered, the vast majority of the Miller clamp current flows directly to the power terminal VEE2 of the drive chip 41 through the triode Q42 which is turned on and has a small on-resistance, thus increasing the Miller clamp current. Therefore, the Miller clamp drive circuit can be employed to drive power switching transistors with higher power and higher switching frequency.

FIG. 9 is a circuit diagram in which a Miller clamp drive circuit and a power switching transistor are connected according to a fourth embodiment of the present invention. As shown in FIG. 9, the Miller clamp drive circuit 5 includes a drive chip 51, a drive resistor R53 and a Miller clamp circuit 50.

The drive chip 51 is the same as the drive chip 21, so its specific circuit topology will not be repeated herein. The drive chip 51 also includes an output terminal OUT, a clamp terminal CLAMP, a power terminal VEE2, and a controllable switch 511 connected between the clamp terminal CLAMP and the power terminal VEE2.

The drive resistor R53 is connected between the output terminal OUT of the drive chip 51 and the gate (i.e., a control electrode) of an Insulated Gate Bipolar Transistor (IGBT) T52.

The Miller clamp circuit 50 is basically the same as the Miller clamp circuit 40 shown in FIG. 7. The difference is that the Miller clamp circuit 50 adopts an enhanced p-channel Metal-Oxide-Semiconductor Field-Effect Transistor (MOSFET) Q52 instead of the triode Q42 in FIG. 7, and is provided with a diode D51 between a node formed by connecting the resistor R52 with a source of the MOSFET Q52 and the gate of the IGBT T52. The gate (i.e., a control electrode) of the MOSFET Q52 is connected to the clamp terminal CLAMP of the drive chip 51, the source of the MOSFET Q52 is connected to a node formed by connecting the negative electrode of the diode D52 and the resistor R52, and a drain of the MOSFET Q52 is connected to the power terminal VEE2 of the drive chip 51.

FIG. 10 shows voltage oscillograms of a driving signal output by the drive chip shown in FIG. 9 and the gate voltage of the IGBT. As shown in FIG. 10, when the output terminal OUT of the drive chip 51 outputs a high level VO (e.g., 15 volt to 18 volt) driving signal, the gate voltage of the IGBT T52 becomes V1 (which is slightly lower than VO) to control the IGBT T52 to be turned on.

A process in which the output terminal OUT of the drive chip 51 outputs a low level V (lower than the ground potential, e.g., −8 volt to −6 volt) driving signal to control the IGBT T52 to be turned off (or cut off) is as follows.

Between moments t1 to t2', a Miller capacitor C52 and a gate capacitor Cge (or a gate-emitter capacitor) of the IGBT T52 begin to discharge slowly through the drive resistor R53, so that the gate voltage of the IGBT T52 decreases slowly from V1 to V+2+Vf+V2 volt, where V is the voltage of the power terminal VEE2, Vf is a voltage drop of the diode D51 (e.g., 0.7 V), and V2 is a voltage drop across resistor R52 in the discharge process.

In this discharge process, the gate of the IGBT T52, the diode D51, the resistor R52, the resistor R51 and the power terminal VEE2 form a conductive path, so that the diode D51 is turned on and has a voltage drop Vf, and the resistor R52 with a smaller resistance value is selected to make the voltage across the resistor R52 lower than the amplitude of the gate threshold voltage (or cut-in voltage) of the MOSFET Q52, so that the MOSFET Q52 is in the cut off state. At the same time, the voltage received by the clamp terminal CLAMP of the drive chip 51 is higher than V+2 volt, so the Miller clamp of the drive chip 51 has not been triggered, and its clamp terminal CLAMP is in a high impedance state.

At the moment t2', the gate voltage of the IGBT T52 drops to V+2+Vf+V2 volt. At this moment, the voltage of the clamp terminal CLAMP of the drive chip 51 is V+2 volt, and the drive chip 51 is in a critical state triggering the Miller clamp.

Between moments t2' to t3', once the gate voltage of the IGBT T52 is lower than V+2+Vf+V2 volt, the Miller clamp of the drive chip 51 is triggered, and the controllable switch 511 is turned on, so that the voltage of the clamp terminal CLAMP is quickly pulled down to V, and the voltage drop (2+V2 volt) across the resistor R52 is greater than the amplitude of the gate threshold voltage (or cut-in voltage) of the MOSFET Q52 so that the MOSFET Q52 is turned on. At this moment, the Miller clamp current flows directly to the power terminal VEE2 of the drive chip 51 through the diode D51 and the on-state MOSFET Q52. When the on-resistance of the selected MOSFET Q52 is less than that of the controllable switch 511, a higher Miller clamp current is allowed to directly flow to the power terminal VEE2 through the on-state MOSFET Q52, thus increasing the Miller clamp current of the drive chip 51.

After the moment t3', the gate voltage of the IGBT T52 is clamped to V+Vf volt, so that the IGBT T52 is in the cut off state.

It can thus be seen that the Miller clamp voltage of the Miller clamp drive circuit 5 increases from V+2 volt to V+2+Vf+V2 volt. The Miller clamp circuit 50 allows the drive chip 51 to trigger the Miller clamp faster, thus shortening the tailing time of the IGBT T52. The Miller clamp current flows directly to the power terminal VEE2 of the drive chip 51 through the MOSFET Q52 which is turned on and has a small on-resistance, thus increasing the Miller clamp current of the drive chip 51. Therefore, the Miller clamp drive circuit 5 can be employed to drive power switching transistors with higher power and higher switching frequency.

In other embodiments of the present invention, the number of diodes connected between the drive resistor and the clamp terminal of a driver is not limited to one or two, and may also be more than two diodes connected in series. For example, the number of diodes connected in series is increased to further increase the Miller clamp voltage.

In other embodiments of the present invention, the triodes Q32 and Q42 in the above embodiments are replaced by enhanced p-channel Metal-Oxide-Semiconductor Field-Effect Transistors (MOSFET), where the gate, source and drain of MOSFET are connected in the same way as the gate, emitter and collector of the triode, respectively.

The drive chip in the Miller clamp drive circuit according to the present invention is not limited to ISO5852, NCD57000 and ADUM4135 drive chips, but may also be other drive chips used for power switching transistors. The power terminal VEE2 of the drive chip has a voltage V lower than the ground potential, and the clamp terminal is connected to the power terminal through the controllable switch such as the MOSFET or the triode. When the voltage received by the clamp terminal is lower than the predetermined Miller clamp voltage of the drive chip, the controllable switch is triggered to be switched on.

The present invention is not intended to limit the voltage of the driving signal output by the drive chip to 15 volt to 18 volt for high level and −8 volt to −6 volt for low level. Depending on the type of the power switching transistor and the drive chip, the voltage of the high and low level driving signals output by the drive chip may be other voltage values.

The Miller clamp drive circuit according to the present invention is not limited to providing a driving signal to the IGBT, but may also provide a required driving signal to the gate (i.e., the control electrode) of the MOSFET.

In other embodiments of the present invention, the diodes D21 and D22 connected in series, or the diodes D41 and D42 connected in series, or the diode D51 in the above embodiments may also be replaced by voltage divider circuits comprising other electronic components with a preset voltage drop.

In other embodiments of the present invention, the resistor R21, R41 or R51 in the above embodiments may also be replaced by a voltage divider circuit comprising other electronic components with appropriate impedances.

In other embodiments of the present invention, the resistor R32, R42 or R52 in the above embodiments may be replaced by a voltage divider circuit comprising other electronic components with appropriate impedances.

Although the present invention has been described by preferred embodiments, the present invention is not limited to the embodiments described herein, but includes various modifications and variations made without departing from the scope of the present invention.

The invention claimed is:

1. A Miller clamp drive circuit comprising:
a drive chip comprising an output terminal configured to output a driving signal, a clamp terminal, a power terminal and a controllable switch connected between the clamp terminal and the power terminal; wherein the drive chip is configured to trigger a Miller clamp to reduce a voltage at the clamp terminal to a voltage at the power terminal when the voltage received at the clamp terminal is less than a predetermined voltage;
a drive resistor, a first terminal of which is connected to the output terminal of the drive chip and a second terminal of which is connected to a control electrode of a power switching transistor; and
a Miller clamp circuit comprising:
a first voltage divider circuit which is connected between the second terminal of the drive resistor and the clamp terminal and configured to provide a preset voltage drop; and
a second voltage divider circuit connected between the clamp terminal and the power terminal.

2. The Miller clamp drive circuit of claim 1, wherein the first voltage divider circuit comprises one diode or a plurality of diodes with positive and negative electrodes thereof connected in series and in sequence.

3. The Miller clamp drive circuit of claim 2, wherein the voltage of the power terminal is less than a ground potential.

4. The Miller clamp drive circuit of claim 1, wherein the second voltage divider circuit is a first resistor.

5. The Miller clamp drive circuit of claim 4, wherein the Miller clamp circuit further comprises:
a third voltage divider circuit connected between the first voltage divider circuit and the second voltage divider circuit; and
a controllable switching device, a control electrode of which is connected to the clamp terminal, a first electrode of which is connected to a node formed by connecting the third voltage divider circuit and the first voltage divider circuit, and a second electrode of which is connected to the power terminal;
wherein when the voltage received by the clamp terminal is lower than a predetermined Miller clamp voltage of the drive chip, the controllable switch is triggered to be switched on, so that the controllable switching device is in the on state, and an on-resistance of the controllable switching device is lower than that of the controllable switch of the drive chip.

6. The Miller clamp drive circuit of claim 5, wherein the third voltage divider circuit is a second resistor, and an amplitude of a voltage across the second resistor is less than that of a turn-on voltage of the controllable switching device when the Miller clamp of the drive chip is not triggered.

7. The Miller clamp drive circuit of claim 6, wherein the controllable switching device is a PNP type triode, a base of which is connected to the clamp terminal, an emitter of which is connected to a node formed by connecting the third voltage divider circuit and the first voltage divider circuit, and a collector of which is connected to the power terminal.

8. The Miller clamp drive circuit of claim 5, wherein the controllable switching device is a PNP type triode, a base of which is connected to the clamp terminal, an emitter of which is connected to a node formed by connecting the third voltage divider circuit and the first voltage divider circuit, and a collector of which is connected to the power terminal.

9. The Miller clamp drive circuit of claim 5, wherein the controllable switching device is an enhanced p-channel Metal-Oxide-Semiconductor Field-Effect Transistor (MOSFET), a gate of which is connected to the clamp terminal, a source of which is connected to a node formed by connecting the third voltage divider circuit and the first voltage divider circuit, and a drain of which is connected to the power terminal.

10. The Miller clamp drive circuit of claim 1, wherein the voltage of the power terminal is less than a ground potential.

11. A Miller clamp drive circuit comprising:
a drive chip comprising an output terminal configured to output a driving signal, a clamp terminal, a power terminal and a controllable switch connected between the clamp terminal and the power terminal; wherein the drive chip is configured to trigger a Miller clamp to reduce a voltage at the clamp terminal to a voltage at the power terminal when the voltage received at the clamp terminal is lower than a predetermined voltage;
a drive resistor, a first terminal of which is connected to the output terminal of the drive chip and a second terminal of which is connected to a control electrode of a power switching transistor; and
a Miller clamp circuit which comprises:
a third voltage divider circuit connected between the clamp terminal and a second terminal of the drive resistor; and
a controllable switching device, a control electrode of which is connected to the clamp terminal, a first electrode of which is connected to the second terminal of the drive resistor, and a second electrode of which is connected to the power terminal;
wherein when the voltage received by the clamp terminal is less than a predetermined Miller clamp voltage of the drive chip, the controllable switch is triggered to be switched on, so that the controllable switching device is in the on state, and an on-resistance of the controllable switching device is less than that of the controllable switch of the drive chip.

12. The Miller clamp drive circuit of claim 11, wherein the third voltage divider circuit is a second resistor, one terminal of which is connected to the clamp terminal and a second terminal of which is connected to the second terminal of the drive resistor, and an amplitude of a voltage across the second resistor is less than that of a turn-on voltage of the controllable switching device when the Miller clamp of the drive chip is not triggered.

13. The Miller clamp drive circuit of claim 11, wherein the Miller clamp circuit further comprises:
   a first voltage divider circuit connected between the second terminal of the drive resistor and the third voltage divider circuit and configured to have a preset voltage drop; and
   a second voltage divider circuit connected between the clamp terminal and the power terminal.

14. The Miller clamp drive circuit of claim 13, wherein the first voltage divider circuit comprises one diode or a plurality of diodes with positive and negative electrodes thereof connected in series and in sequence.

15. The Miller clamp drive circuit of claim 14, wherein the controllable switching device is a PNP type triode, a base of which is connected to the clamp terminal, an emitter of which is connected to a node formed by connecting the first voltage divider circuit and the third voltage divider circuit, and a collector of which is connected to the power terminal.

16. The Miller clamp drive circuit of claim 13, wherein the second voltage divider circuit is a first resistor.

17. The Miller clamp drive circuit of claim 13, wherein the controllable switching device is a PNP type triode, a base of which is connected to the clamp terminal, an emitter of which is connected to a node formed by connecting the first voltage divider circuit and the third voltage divider circuit, and a collector of which is connected to the power terminal.

18. The Miller clamp drive circuit of claim 13, wherein the controllable switching device is an enhanced p-channel Metal-Oxide-Semiconductor Field-Effect Transistor (MOSFET), a gate of which is connected to the clamp terminal, a source of which is connected to a node formed by connecting the first voltage divider circuit and the third voltage divider circuit, and a drain of which is connected to the power terminal.

19. The Miller clamp drive circuit of claim 11, wherein the voltage of the power terminal is less than a ground potential.

* * * * *